United States Patent [19]

Hufnagel

[11] 3,946,278
[45] Mar. 23, 1976

[54] FAIL-SAFE FOUR LEADED ZENER DIODE ARRANGEMENT

[75] Inventor: Andrew Hufnagel, Pittsburgh, Pa.

[73] Assignee: Westinghouse Air Brake Company, Swissvale, Pa.

[22] Filed: Dec. 19, 1973

[21] Appl. No.: 426,031

[52] U.S. Cl. ............... 317/16; 307/302; 307/318; 317/31; 323/22 Z; 357/13
[51] Int. Cl.² .......................................... H02H 7/00
[58] Field of Search.. 323/22 Z; 317/16, 31, 33 VR, 317/235 T, 61.5, 69; 307/302, 303, 318; 357/13

[56] References Cited
UNITED STATES PATENTS

| | | | |
|---|---|---|---|
| 2,841,771 | 7/1958 | Dunleavey | 333/79 |
| 3,275,845 | 9/1966 | Sanky | 317/235 T |
| 3,439,230 | 4/1969 | Lambert et al. | 317/230 |
| 3,527,985 | 9/1970 | Brown | 317/16 |
| 3,614,539 | 10/1971 | Hallenbeck | 317/31 |
| 3,624,449 | 11/1971 | Morgan | 317/31 |
| 3,813,578 | 5/1974 | Tiffany | 317/31 |
| 3,842,334 | 10/1974 | Franz | 321/2 |

OTHER PUBLICATIONS

Electronics, Langford, "Three Approaches to Microminiaturization," pp. 49–51, Dec. 11, 1959.
Motorola, Silicon Zener Diode and Rectifier Handbook, Third Edition, p. 156, 1961.

*Primary Examiner*—William M. Shoop
*Attorney, Agent, or Firm*—J. B. Sotak; R. W. McIntire, Jr.

[57] ABSTRACT

This disclosure relates to a fail-safe voltage regulating arrangement including a current limiting resistor and a four leaded zener diode having two separate conductive leads electrically connected to the cathode electrode and two other separate conductive leads connected to the anode electrode for producing a constant d.c. voltage barring a critical component or circuit failure.

6 Claims, 4 Drawing Figures

FAIL-SAFE FOUR LEADED ZENER DIODE ARRANGEMENT

FIELD OF THE INVENTION

This invention relates to a vital type of voltage regulating device and more particularly to a fail-safe four leaded zener diode having a first pair of leads electrically contacting the P-type material and having a second pair of leads electrically contacting the N-type material so that the loss of one or more of the leads or an opening at the zener diode is incapable of causing an unsafe condition.

BACKGROUND OF THE INVENTION

It is essential that certain equipment, such as, signal, control and communication apparatus for railroad and mass and/or rapid transit installations, operate in a fail-safe manner. In order to ensure safe operation, it is necessary to meticulously analyze and carefully examine each device, component, circuit and network for all possible and conceivable failures. In addition to changes in the component parameters and circuit characteristics which occur due to temperature variations and due to deterioration with age, there are two common dramatic malfunctions, namely, a short circuit and open circuit, which must be positively protected against in order to prevent an unsafe condition. For example, it is mandatory to fully consider how minute changes in the values of both passive and active elements will effect the operation of the circuits and overall system, and also what adverse results will occur when a resistor, capacitor, inductor, diode, transistor, etc. becomes short or open circuited. It is readily apparent that a further prerequisite in the vital operation of electrical and electronic circuits and apparatus is a suitable voltage supply source. In the past, it was common practice to employ an appropriate voltage responsive device or means for regulating and stabilizing the voltage level of the power supply. In keeping with fail-safe design principles, it must be assumed that the amplitude of the regulated voltage will remain substantially constant and that under no circumstance will the voltage increase in value. Thus, a circuit or component failure in a fail-safe voltage regulator must not be capable of causing a rise in the supply voltage. In previous types of shunt regulators employing conventional voltage breakdown devices an unsafe condition prevailed whenever the breakdown device failed in an open circuit manner. That is, in prior art regulators a poor or high resistance solder joint, a loss of a connection or lead or an open circuit failure of the voltage breakdown device results in the loss of regulation and causes a marked increase in the voltage level. The loss of regulation is intolerable in a fail-safe operation since increased voltage levels are capable of causing erratic operation and critical circuit malfunctions which can impair the security and integrity of the overall system. Thus, previously known voltage regulators are not suitable and are not generally recommended for use in vital types of transit operations since the appearance of a critical failure can jeopardize the safety of individuals and can result in severe damage to the equipment.

OBJECTS OF THE INVENTION

With the above and other objects in view, it is proposed, in accordance to this invention, to provide a vital type of voltage breakdown device which operates in a fail-safe manner.

Another object of this invention is to provide a fail-safe voltage regulating circuit arrangement employing a four leaded voltage breakdown device.

A further object of this invention is to provide a vital type of voltage regulating circuit arrangement utilizing a four leaded zener diode.

Yet another object of this invention is to provide a vital type of voltage responsive device having four separate conductors.

Yet a further object of this invention is to provide a fail-safe voltage breakdown device including an anode and a cathode and having two leads electrically contacting the anode and having two leads electrically contacting the cathode.

Still another object of this invention is to provide a shunt type of voltage regulator employing a breakdown diode having a body of semiconductive material forming a PN junction and having a first pair of conductors attached to the N-type of semiconductive material and having a second pair of conductors attached to the P-type of semiconductive material.

Still a further object of this invention is to provide a shunt type of regulating circuit arrangement utilizing a planar type of zener diode having two separate conductors connected to the anode electrode and having two separate conductors connected to the cathode electrode.

An additional object of this invention is to provide a vital type of zener diode which is constructed to have two individual leads contacting the P-type semiconductive material and to have two individual leads contacting the N-type semiconductive material.

Yet an additional object of this invention is to provide a voltage regulating circuit arrangement employing a series resistor and shunt voltage breakdown device which operate in a fail-safe manner.

Still an additional object of this invention is to provide a fail-safe voltage regulating device that is simple in construction, economical in cost, reliable in operation, efficient in operation and durable in serice.

SUMMARY OF THE INVENTION

In accordance with the present invention, the vital type of shunt voltage regulating circuit arrangement includes a source of d.c. voltage, a current limiting resistor and a four leaded zener diode supplying constant voltage to a load. The four leaded zener diode includes a body having semiconductive material forming a PN junction. The P-type and the N-type of semiconductive material may be arranged to form a cubical or planar type of zener diode. A first pair of conductors electrically connected to the N-type of semiconductive material forming the cathode electrode, and a second pair of conductors electrically connected to the P-type of semiconductive material forming the anode electrode. The current limiting resistor is connected from one terminal of the source of d.c. voltage to one lead of the first pair of conductors. One lead of the second pair of conductors is connected to the other terminal of the source of d.c. voltage. The other lead of the first and the second pair of conductors is connected to the respective ends of a suitable load.

DESCRIPTION OF THE INVENTION

Figure 1:
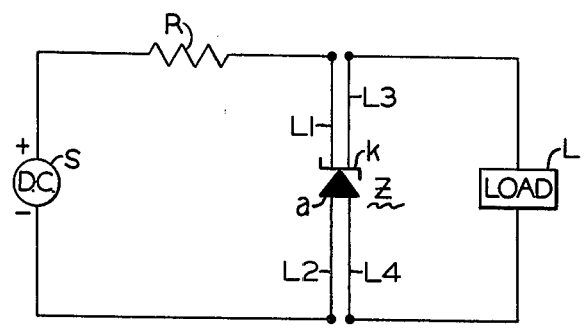
FIG. 1 schematically illustrates the vital type of voltage regulating circuit arrangement embodying the principles in accordance with the present invention.

Referring now to the drawings and in particular to FIG. 1, there is shown a fail-safe shunt type of voltage regulator employing a current limiting resistor R and a four leaded voltage breakdown device or zener diode Z. As shown, a suitable source S of d.c. supply voltage has its positive terminal + connected to one end of the current limiting resistor R. The resistor R is a commercially available resistance element which is preferably constructed of carbon composition so that it is incapable of becoming short circuited. The four leaded zener diode Z is perferably a diffused constructed device which includes a cathode electrode $k$ and an anode electrode $a$. As shown, the cathode electrode $k$ is connected by lead L1 to the other end of resistor R while the anode electrode $a$ is connected by lead L2 to the negative terminal — of the d.c. voltage source S. The zener diode Z1 also includes two other conductors or leads L3 and L4 which are separate and distinct from leads L1 and L2. As shown, the lead L3 is connected from the cathode electrode $k$ to one side of load L while the lead L4 is connected from the anode electrode $a$ to the other side of load L.

The voltage regulating circuit or device of FIG. 1 operates in the conventional manner to maintain a predetermined constant voltage even though the d.c. input potential changes or the load varies. Let us assume that the circuit is operating properly in that the resistor R and zener diode Z are intact that the voltage source S is connected to the input terminals and that the load L is connected across the output terminals. When the d.c. input voltage from source S reaches a certain level, namely, the avalance voltage or breakdown voltage, the zener diode Z will conduct and will cause a constant voltage to be maintained across it. If the d.c. voltage of source S rises, the diode Z will conduct more current but a great voltage drop will occur across resistor R so that the voltage across zener diode Z remains constant. Conversely, a decrease in the d.c. voltage causes a decrease in the current flowing through diode Z which causes a smaller voltage drop across resistor R so that the output voltage supplied to load is held constant. Similarly, a variation in the load demands causes the amount of current flowing through the diode to vary so that the voltage drop across resistor R is altered and therefore, maintains a constant output voltage. Thus, a constant d.c. voltage is produced by the zener diode Z, and under no circumstance is the output voltage capable of rising above the avalance of breakdown level. That is, the present voltage regulating circuit operates in a fail-safe manner in that no critical component or circuit failure is able to increase the d.c. voltage above the zener breakdown voltage level. As mentioned above, previous types of shunt regulators employing conventional two leaded breakdown devices are not fail-safe in that the loss of a lead or connection to the cathode or anode electrode resulted in an increase in the output voltage due to the loss of the regulating action. In the present invention, the loss of any of the leads L1, L2, L3 or L4 is incapable of increasing the output voltage level. For example, the disconnection of lead L1 or L2 destroys the integrity of the input circuit so that zener diode Z is incapable of conducting and producing an output voltage across leads L3 and L4. Likewise, the loss of lead L3 or L4 interrupts the output circuit so that the d.c. voltage developed across the zener diode is incapable of being conveyed to load L. It is readily evident that the shorting of the zener diode is a safe failure in that the source voltage is short circuited. As previously mentioned, the resistor R is incapable of becoming shorted due to its unique construction, and the opening of the resistor R results in the interruption of the circuit so that no output voltage is produced. Thus, in the present invention no conceivable critical component or circuit failure is capable of erroneously increasing the output voltage above the zener breakdown level.

Figure 2:
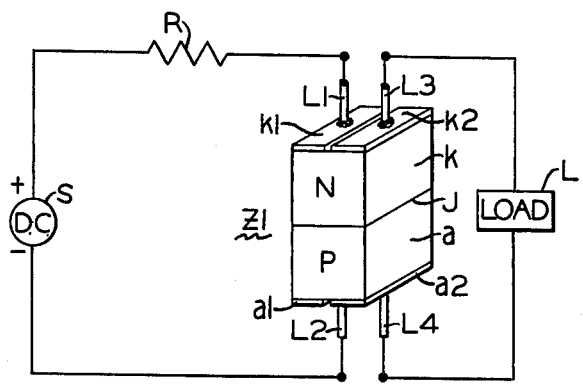
FIG. 2 is a schematic circuit diagram similar to FIG. 1 but illustrating a perspective view of a cubical type of four leaded zener diode.

Referring now to FIG. 2, there is shown a regulating circuit which functions in the same manner and is substantially identical to that of FIG. 1 with the exception that the four leaded regulating device or zener diode Z1 is shown in perspective. The zener diode Z1 includes a crystaline cubical or body structure of semiconductive material. The semiconductive crystaline body includes an N-type region forming the cathode $k$ and a P-type region forming an anode $a$. A barrier or junction J exists between the N-type and P-type regions. As shown, the junction J is a substantially flat contiguous surface formed between the two opposite conductivity regions. The upper end or surface of the N-type conductivity region includes metalized conductive areas $k1$ and $k2$ while the lower end or surface of the P-type conductivity region includes metalized conductive areas $a1$ and $a2$. The areas $k1$ and $k2$ may be formed for example by depositing or plating copper or other conductive metal to provide a suitable ohmic connection for the respective cathode leads L1 and L3. Similarly, the deposited copper layers or conductive plates $a1$ and $a2$ form a convenient contact connection for the anode leads L2 and L4. The anode and cathode leads electrically contact the associated conductive layers and are securely attached thereto by soldering or welding. After the leads are connected to the appropriate copper areas the device may be encapsulated in suitable insulative material or covered with an appropriate package to protect the diode against contaminants or corrosive constitutents in the surrounding milieu. As mentioned above, the loss of any connection or lead or an opening at the zener diode Z1 will not result in an increase of the outpupt voltage since the necessary continuity between leads L1 and L3 or L2 and L4 is destroyed. Obviously the shorting of the zener diode reduces the output voltage to zero.

Figure 3:
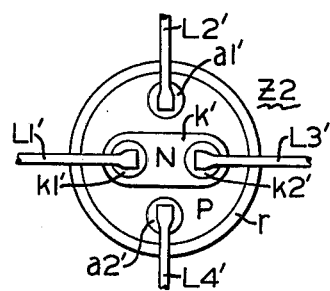
FIG. 3 is a top plan view of a planar type of four leaded zener diode.
Figure 4:
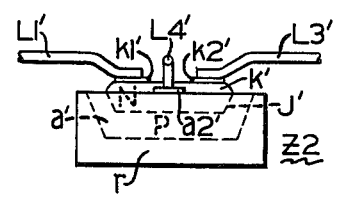
FIG. 4 is a side elevational view of the planar diode of FIG. 3.

Turning now to FIGS. 3 and 4, there is shown a modified embodiment of the voltage breakdown device. It will be observed that the breakdown device is a planar type of zener diode Z2. The zener diode Z2 includes a crystaline body formed of a semi-conductive material, such as, germanium, silicon or the like. It will be noted that the upper body portion of the crystal is doped by a donor suitable substance to form an N-type region or cathode $k'$ while the lower body portion is injected with an acceptor substance to form a P-type region or anode $a'$. As shown in FIG. 4, a multi-surfaced or faceted contiguous border or junction $J'$ is formed between the upper N-type region and the lower P-type region. A cup-shaped retainer r surrounds the outer peripheral edge and bottom of the anode $a$ and holds it in place. It will be noted that the upper surfaces of the cathode $k$ and the anode $a$ are provided with suitable metallic areas which are deposited or plated by various methods known in the art. The bonded circular metal layers $k1'$ and $k2'$ form ohmic connections for leads L1' and L3', respectively, which are soldered or welded thereto. The bonded circular metal layers $a1'$ and $a2'$ form ohmic connections for lead L2' and L4', respectively, which are securely attached thereto by soldering or welding. After attachment of the conductors or leads, the assembly may be encased in a suitable protective package. Like diodes Z and Z1, the planar device Z2 of FIGS. 3 and 4, is a fail-safe four leaded zener diode.

Thus the presently described fail-safe voltage breakdown devices or zener diodes permit the employment of shunt type of voltage regulating circuits in vital applications. That is, the voltage regulating circuit operates in a fail-safe fashion in that no critical component or circuit failure is capable of increasing the output voltage above the zener breakdown level. Further, it will be understood that it is necessary to employ certain precautionary measures in regard to the design and layout of the circuit in order to ensure that leads in proximity to each other are incapable of touching each other to create a short circuit. As mentioned above, the resistive element is preferably constructed of a carbon composition so that it is incapable of becoming short circuited. In addition, the use of the four leaded zener diode ensures that the loss of a lead will not cause an unsafe condition.

It will be appreciated that while the present invention finds particular utility in railroad and mass/or rapid transit operations and in particular in voltage regulators therefore, it is understood that the four leaded voltage breakdown devices may be employed in other circuits and systems which have need of the disclosed characteristics.

In addition, it will be readily evident that this invention may be used in other various systems and apparatus, such as, surveillance and security equipment, aerospace apparatus, and other instruments, appliances and machines which require the vitality and safety inherently present in this invention.

Additionally, it is understood that other changes, modifications and alterations may be employed by those skilled in the art without departing from the spirit and scope of this invention. For example, the particular size, shape and material of the crystaline body of the semiconductive zener diode is a matter of design and choice and may be changed and selected in accordance with the particular application and desired characteristics. For example, the semiconductive body may be cylindrically shaped or may be part of an integrated circuit chip. In addition, the size, thickness, shape and the material of the conductive layers may vary in accordance with design and required power ratings and the like. Thus, although specific embodiments and applications of this invention have been shown and described, it will be understood that they should be taken in an illustrative and diagrammatic sense only.

Having now described the invention what I claim as new and desire to secure by Letters Patent, is:

1. A vital type of voltage breakdown device comprising, a body of semiconductive material having one region of one conductivity type and having another region of opposite conductivity type forming a junction therebetween and a first pair of separate conductors electrically contacting said one region of one conductivity type and a second pair of separate conductors electrically contacting said other region of the opposite conductivity type, and the junction between said one region of one conductivity type and said other region of opposite conductivity type is a multi-surface contiguous border, 2. A vital type of voltage breakdown device as defined in claim 1, wherein the two surfaces of said semiconductive body include conductive connections to which said first and said second pair of separate conductors are electrically attached.

3. A vital type of voltage breakdown device as defined in claim 1, wherein the ends of said semiconductive body include conductive surfaces for accommodating said first and said second pair of separate conductors.

4. A vital type of voltage breakdown device comprising, a body of semiconductive material having one region of one conductivity type and having another region of opposite conductivity type forming a junction therebetween and a first pair of separate conductors electrically contacting said one region of one conductivity type and a second pair of separate conductors electrically contacting said other region of the opposite conductivity type, and the top of said semiconductive body includes a plurality of conductive surfaces for accommodating said first and said second pair of separate conductors.

5. A vital type of voltage breakdown device as defined in calim 4, wherein the junction between said one region of one conductivity type and said other region of the opposite conductivity type is a substantially flat contiguous surface.

6. A vital type of voltage breakdown device comprising, a body of semiconductive material having one region of one conductivity type and having another region of opposite conductivity type forming a junction therebetween and a first pair of separate conductors electrically contacting said one region of one conductivity type and a second pair of separate conductors electrically contacting said other region of the opposite conductivity type, and said one region of one conductivity type includes a pair of conductive surfaces for accommodating said first pair of separate conductors and said other region of opposite conductivity includes a pair of conductive surfaces for accommodating said second pair of conductors.

* * * * *